(12) United States Patent
Hahn et al.

(10) Patent No.: US 6,816,021 B2
(45) Date of Patent: Nov. 9, 2004

(54) MULTIPLE BAND LOCAL OSCILLATOR FREQUENCY GENERATION CIRCUIT

(75) Inventors: Wilhelm S. Hahn, Los Altos, CA (US); Emmanuel Riou, Santa Clara, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 1 day.

(21) Appl. No.: 10/229,598

(22) Filed: Aug. 27, 2002

(65) Prior Publication Data

US 2004/0041642 A1 Mar. 4, 2004

(51) Int. Cl.[7] .................................................. H03B 5/34
(52) U.S. Cl. .......................... 331/74; 331/73; 331/43; 327/105
(58) Field of Search ......................... 331/74, 76, 77, 331/37, 38, 42, 43; 327/105, 291, 293, 294; 455/76, 77, 208, 86, 87, 209, 255–257

(56) References Cited

U.S. PATENT DOCUMENTS

| | | | | |
|---|---|---|---|---|
| 4,211,975 A | * | 7/1980 | Kuroda | 455/75 |
| 4,249,138 A | * | 2/1981 | Bell | 331/1 A |
| 4,561,014 A | * | 12/1985 | Douziech et al. | 348/507 |
| 4,602,220 A | * | 7/1986 | Kurihara | 331/19 |
| 4,831,339 A | * | 5/1989 | Nemeth | 331/25 |
| 5,109,532 A | * | 4/1992 | Petrovic et al. | 455/63 |
| 5,852,603 A | * | 12/1998 | Lehtinen et al. | 370/280 |
| 6,029,052 A | * | 2/2000 | Isberg et al. | 455/131 |
| 6,061,575 A | * | 5/2000 | Lombardi | 455/552 |
| 6,072,992 A | * | 6/2000 | Mishima et al. | 455/76 |
| 6,087,865 A | * | 7/2000 | Bradley | 327/117 |
| 6,122,326 A | * | 9/2000 | Jackson et al. | 375/308 |
| 6,163,223 A | * | 12/2000 | Kapetanic et al. | 331/2 |
| 6,366,620 B1 | * | 4/2002 | Jackson et al. | 375/308 |
| 6,366,767 B1 | * | 4/2002 | Niratsuka et al. | 455/255 |
| 6,438,177 B1 | * | 8/2002 | Ikeda | 375/316 |
| 6,492,914 B2 | * | 12/2002 | Katoh | 341/50 |
| 6,574,462 B1 | * | 6/2003 | Strange | 455/318 |
| 6,603,362 B2 | * | 8/2003 | Von Dolteren, Jr. | 331/25 |

* cited by examiner

Primary Examiner—Timothy P. Callahan
Assistant Examiner—Hai L. Nguyen
(74) Attorney, Agent, or Firm—Aaron Waxler

(57) ABSTRACT

A multi-band local oscillator for generating an output oscillator signal of a desired frequency is implemented with a single voltage controlled oscillator providing an input oscillator signal and a switch divider block. The output signal is passed through a selected one of a set of filters for band switching and through a frequency divider and subsequently mixed with the input oscillator signal of the voltage controlled oscillator.

11 Claims, 6 Drawing Sheets

MULTIPLE BAND LOCAL OSCILLATOR FREQUENCY GENERATION CIRCUIT

FIELD OF THE INVENTION

The invention relates generally to semiconductor integrated circuit (IC) devices and more particularly, it relates to a local oscillator (LO) frequency generation circuit for use in a transmitter or a receiver of a communication device operating for example in a wireless local area network. The invention is particularly relevant for combo devices requiring a multi-band local oscillator such as an IEEE802.11g wireless device. Other applications for the invention comprise transmitters or receivers that need to operate at various frequency bands over a wireless or terrestrial medium.

BACKGROUND OF THE INVENTION

Devices with local frequency oscillators have been used in many applications, ranging from cellular phones to television tuners to wireless local area networks (WLAN) or wireless personal area networks that implement various standardized protocols, e.g., IEEE802.15, IEEE 802.11 a/b, HiperLAN2 or Zigbee. A wireless device receives radio signals through its receiver via an antenna. The radio signals are mixed with LO frequency signals generated from a LO frequency generation circuit for further processing to generate baseband signals. The receiver is typically capable of receiving radio signals in multiple frequency bands. Currently, there are several ways to realize the LO frequency band switch for generating frequency signals to produce multiple frequency bands.

Conventionally, a simple implementation comprises several voltage-controlled oscillators (VCO), one for each of the frequencies desired to be generated and a multiplexer. The multiplexer allows selection of a given frequency from the desired frequencies. The main drawback of this technique is the long switching time and the large silicon area required.

Another approach is to use only one VCO in conjunction with a capacitor bank. The wanted frequency is then generated by switching among selected capacitors in the capacitor bank.

Another known technique is to use one VCO followed by a frequency divider with a divisor of N. By switching on or off the frequency divider, frequencies that are integer subharmonics of the VCO frequency can be generated. The limitation of this technique is that it works only for small integers and cannot generate non-integer band frequency ratios. Furthermore, a high frequency VCO is usually required.

Therefore, there is a need for an improved LO frequency generation circuit with superior performance.

SUMMARY OF THE INVENTION

It is an object of the invention to provide a multi-band local oscillator implementation with a unique oscillator generating the various frequency bands.

It is another object of the invention to provide a local oscillator generation circuit offering a greater flexibility for choosing the frequency range of the voltage controlled oscillator than currently existing implementations.

To this end, a LO frequency generation circuit of the invention generates an output LO frequency signal from an input frequency signal. The circuit comprises a switch circuit including a switch and a plurality of filters. The switch circuit is configured to filter the output LO frequency signal through one of the filters to produce a filtered frequency signal. A frequency divider is configured to multiply a frequency of the filtered frequency signal by a preset ratio for generating a secondary output frequency signal. The output LO frequency signal is generated in a mixer mixing the input frequency signal with the secondary output frequency signal.

A circuit of the invention enables to generate an output signal of a desired frequency by switching to the appropriate filter of the switch circuit. Thus, by setting the appropriate frequency of the input frequency signal and the appropriate characteristics for the filter and the divider, the desired output frequency signal may be generated. The desired frequency band may thereafter be obtained based on the frequency band of the input frequency signal. The input frequency signal may be obtained from a local voltage controlled oscillator (VCO). The characteristics of the switch circuit and the frequency divider may be determined based on the oscillating frequency of the VCO and the desired frequency of the output frequency signal to achieve. For each filter of the switch circuit a given output LO frequency may be generated. In an embodiment, the switch circuit allows switching between a low-pass filter and a high pass filter and the invention thereby enables deriving two frequencies and corresponding two frequency bands. An advantage of the invention is therefore to enable the generation of different frequency bands using a single voltage controlled oscillator. Another advantage of the invention is to enable the generation of frequency bands that are situated above and below the input frequency of the VCO. Thus, the invention enables a greater flexibility in the choice of the frequency bands at which the VCO operates. The frequency may be therefore chosen to optimize the phase noise and the tuning range and consequently, the frequency band of the VCO may be made smaller to reduce the phase noise incurred.

In another embodiment of the invention, the circuit of the invention may be used to generate other frequencies by inserting a circuit of the invention in lieu of the frequency divider. Such a circuit therefore comprises two switch circuits and in an embodiment where the switch circuit enables switching between a high pass filter and a low-pass filter, four frequencies may be generated from the four possible combinations of filters as will be shown hereinafter. In further embodiments, the output LO frequency signal may be generated from a cascade of circuits of the invention.

Other objects and attainments together with a fuller understanding of the invention will become apparent and appreciated by referring to the following description and claims taken in conjunction with the accompanying drawings.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions.

DETAILED DESCRIPTION

Figure 1:
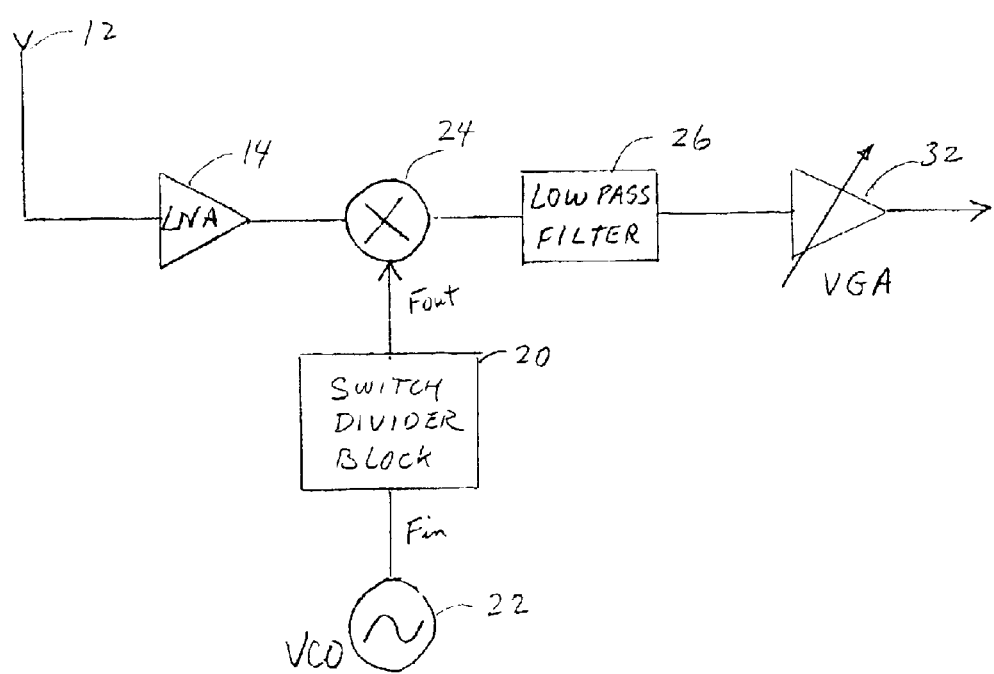
FIG. 1 shows a functional block diagram of a receiver for use in a wireless device, in accordance with an embodiment of the present invention.

FIG. 1 shows a functional block diagram of a receiver 10 for use in a wireless device, according to one embodiment of the invention. Receiver 10 receives radio signals via antenna 12. Radio signals are amplified by a low noise amplifier (LNA) 14. Receiver 10 includes a voltage controlled oscillator (VCO) 22, which generates a frequency signal Fin which is input to a switch divider block 20. Block 20 generates a local oscillator (LO) frequency signal Fout which may be in different frequency bands for mixing with the amplified frequency signals from LNA 14 via a mixer 24. The mixed frequency signals are filtered by a low pass filter 26, which provides the filtered signals to a variable gain amplifier (VGA) 32 for generating baseband signals.

Figure 2:
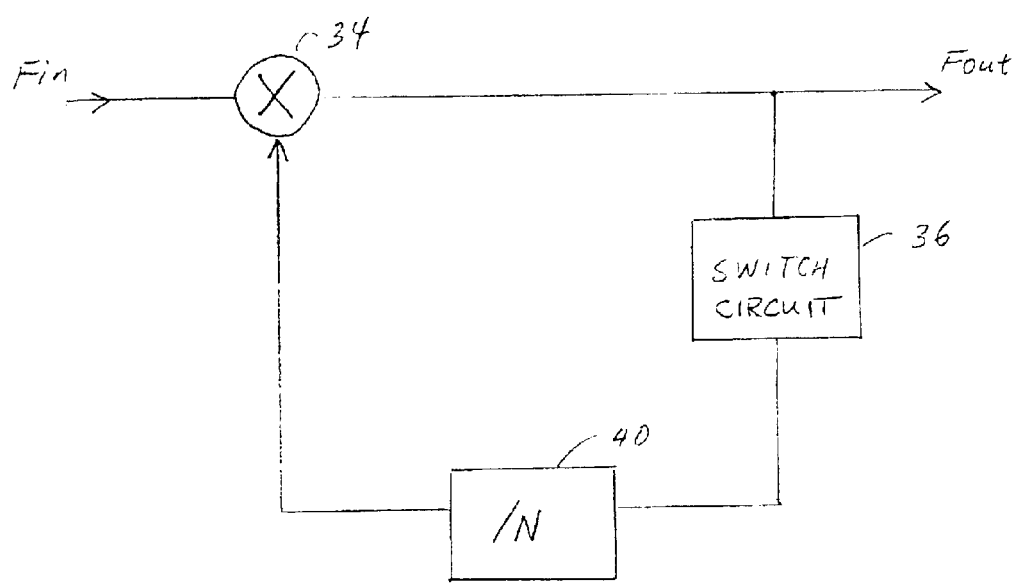
FIG. 2 shows an I/O circuit according to one embodiment of the invention.

FIG. 2 shows a functional block diagram for a switch divider block 20 according to a first embodiment of the invention. Block 20 includes a mixer 34, a switch circuit 36, and a frequency divider 40. Input frequency signal Fin is provided to switch divider block 20 from VCO 22 to generate an output frequency signal Fout. Output frequency signal Fout is fed back via switch circuit 36 and frequency divider 40 and is mixed with input frequency signal Fin by mixer 34. Switch circuit 36 includes a plurality frequency filters that allow only selected frequencies to be mixed with Fin, as will be described in more detail below. Divider 40 further divides the frequency selected in switch circuit 36 by a preset divider ratio. In another embodiment of the invention, divider 40 is placed before switch circuit 36 so that the output frequency signal Fout is first passed through divider 40 for frequency division and then filtered through a selected one of the filters of switch circuit 36. Such implementation requires frequency filters with steeper characteristics than the filters of the embodiments shown in FIG. 2 since incoming frequencies to the filters may be condensed in a smaller band.

Figure 3:
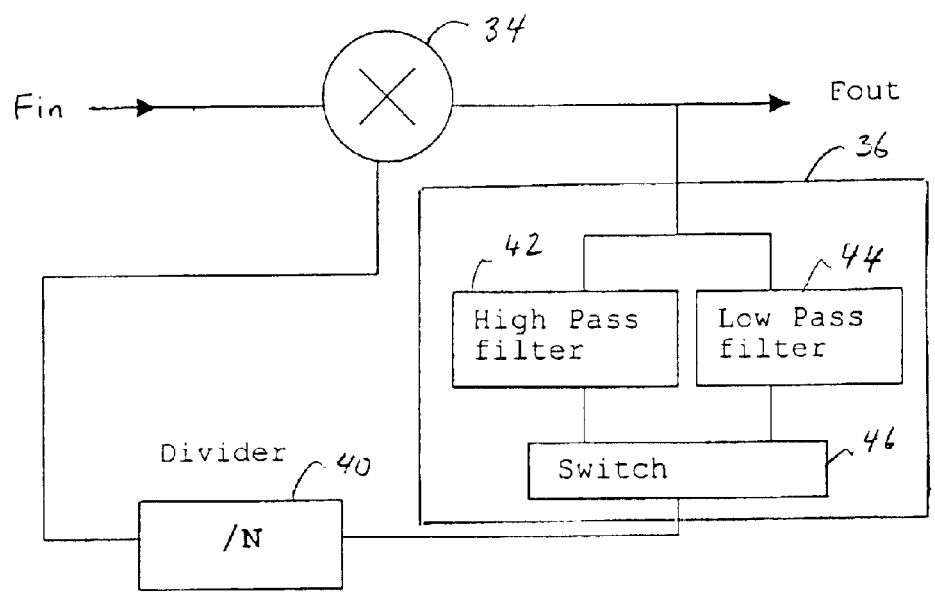
FIG. 3 shows an exemplary schematic diagram of the detection circuit according to one embodiment of the invention.

FIG. 3 illustrates an implementation of switch circuit 36 in a switch divider block 30, according to a second embodiment of the invention. Switch circuit 36 includes a high pass filter 42, a low pass filter 44 and a switch 46. Switch 46 allows selection between high pass filter 42 and low pass filter 44. If high pass filter 42 is selected, Fout is expressed as Fout=(N/(N−1))*Fin. On the other hand, if low pass filter 44 is selected, then Fout=(N/(N+1))*Fin. As an example, in a wireless device implementing the IEEE 802.11a/b protocol standards, with N=3 and a VCO frequency Fin=3.5 GHz, the following are generated: with the high pass filter being selected Fout=5.25 GHz, and with the low pass filter being selected Fout=2.625 GHz.

Figure 4:
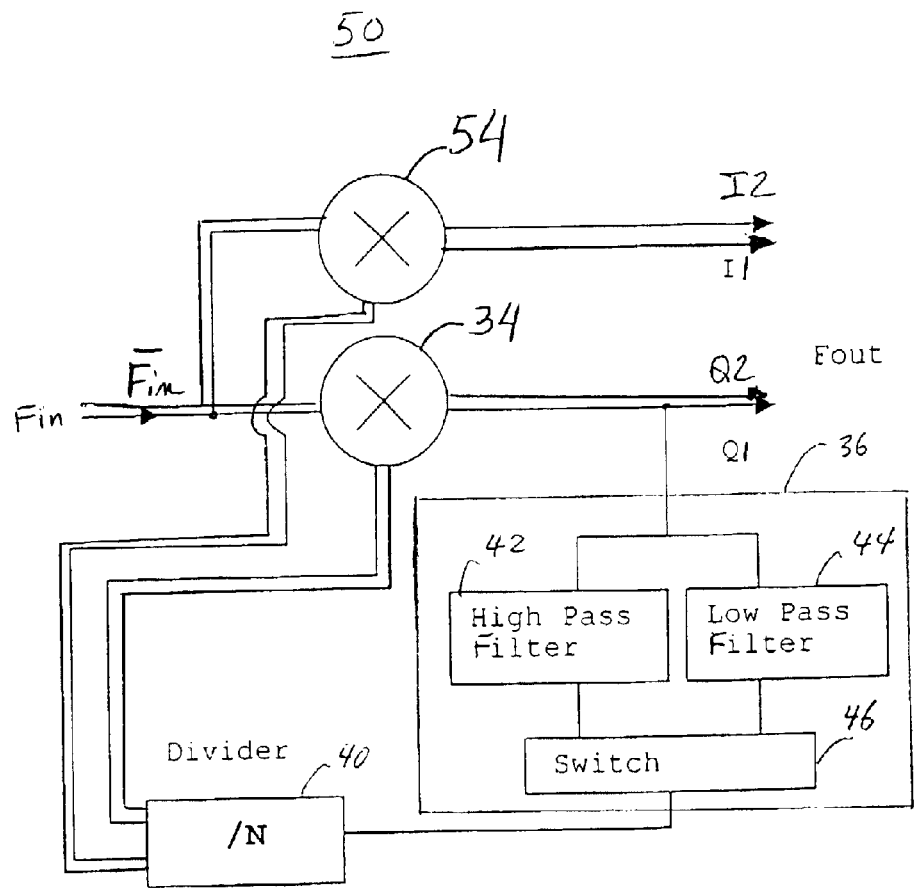
FIG. 4 shows an exemplary schematic diagram of the voltage reference circuit according to one embodiment of the invention.

FIG. 4 shows a switch divider block 50 according to a third embodiment of the invention. This embodiment is similar to that in FIG. 3, except that a second mixer 54 is added and the divisor N of frequency divider 40 is set to an even number. This embodiment takes the advantage of the intrinsic characteristic of the divider 40 having an even ratio to generate both in-phase outputs 11 and 12 (11 shifted by 180°) and both quadrature outputs: Q1 and Q2 (Q1 shifted by 180°). Indeed, a divider with an even ratio can be used to generate a given signal and its shifted versions shifted by 90° and 270°. Thus when the divider 40 provides an output signal, it also provides the shifted versions by 90°, 180° and 270°.

Figure 5:
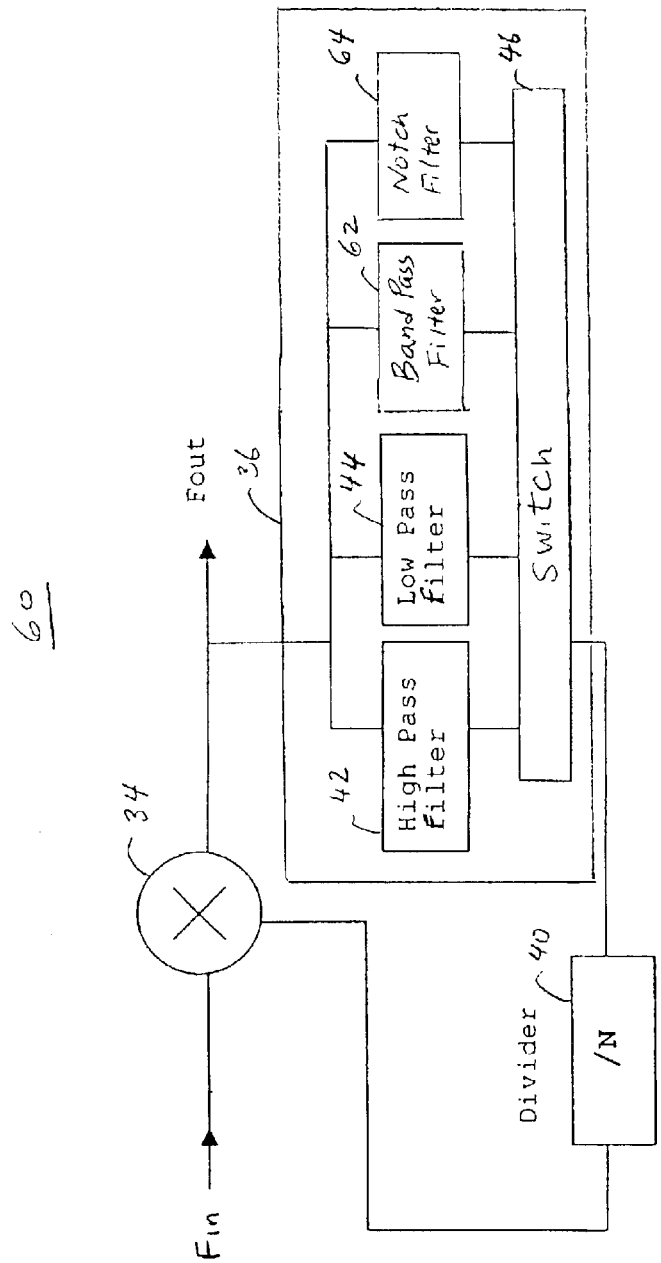
FIG. 5 shows a switch device block according to one embodiment of the invention.

FIG. 5 shows a switch divider block 60 according to a fourth embodiment of the invention. This embodiment is also similar to that in FIG. 3, but includes a different implementation of switch circuit 36. In FIG. 5, switch circuit 36 includes a band pass filter 62 and a notch filter 64, in addition to high pass filter 42, low pass filter 44 and switch 46. Switch 46 allows selection among the four filters. The serial notch filter 64 may operate as a high or low frequency depending on its setting. Switching the switch 46 enables to select one of the filters 62, 64, 42 or 44 operating as a high-pass or a low-pass filter. Thus, the output frequency signal Fout may be passed through a low-pass filter or a high pass filter depending on the desired frequency. If the selected filter 42, 62 or 64 operates as a high-pass filter the output frequency signal Fout may be expressed as follows: Fout=(N/(N−1)*Fin. If the selected filter operates as a low-pass filter the output frequency signal may be expressed as follows: Fout=(N/(N+1))*Fin.

In the above embodiments, the divisor N of frequency divider 40 can be an integer number or a fractional number. Furthermore, frequency divider 40 can be replaced by the switch divider block described above, as illustrated in FIG. 6 thereby creating a cascaded implementation of frequency dividers 40.

Figure 6:
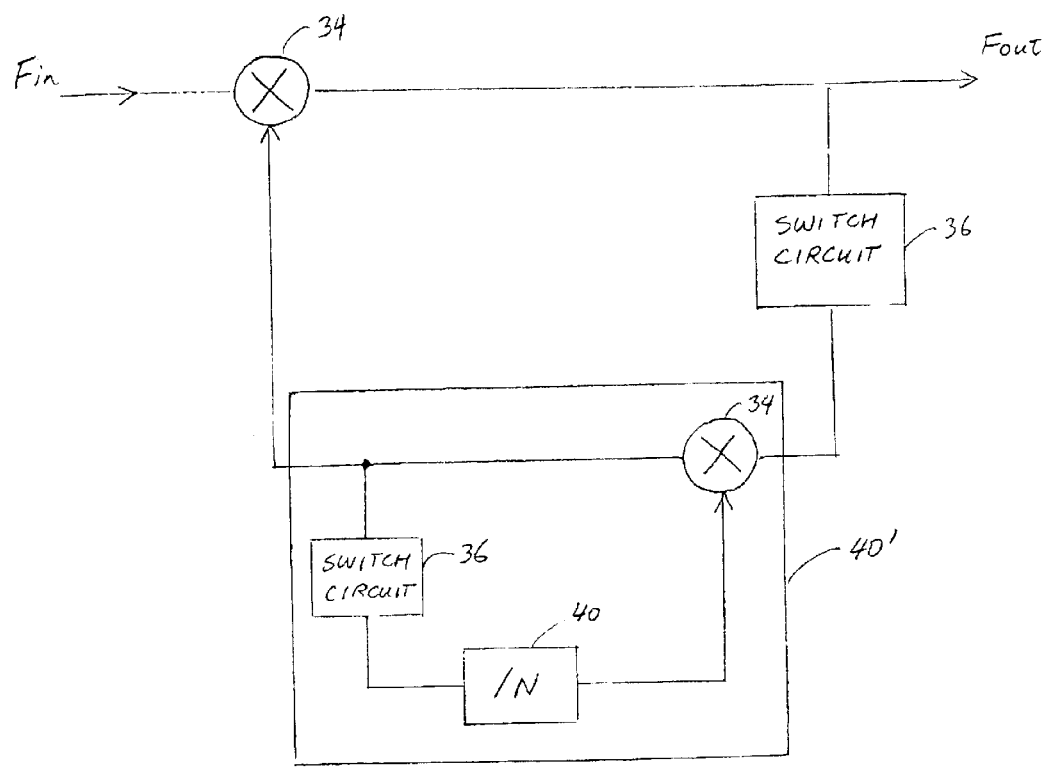
FIG. 6 shows a switch device block according to a further embodiment of the invention.

FIG. 6 shows a switch divider block 70 according to a fifth embodiment of the invention. This embodiment is similar to that in FIG. 2, but frequency divider 40 is replaced with another switch divider block 40'. The frequency divider in block 40' may further be replaced with yet another switch divider block and so on. In doing so, $2^k$ frequency bands can be generated and selected, with k being the number of switch divider blocks being used. Thus, by using 2 switch divider blocks, 4 frequency bands can be generated; and by using 3 switch divider blocks, 8 frequency bands can be generated and so on. The frequency band of Fout is directly obtained from the frequency band of Fin being the frequency band of the VCO generating Fin. Such embodiment permits to use a VCO with a smaller band since the invention enables to generate a greater frequency band for Fout. Thus, the band of the VCO may be chosen to minimize the phase noise.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims.

What is claimed is:

1. A local oscillator (LO) circuit for generating an output LO frequency signal from an input frequency signal, comprising:

a direct signal path and a feedback signal path;

a switch circuit in said feedback signal path comprising a switch and a plurality of filters, the switch circuit being configured to selectively filter the output LO frequency signal through one of the filters to produce a filtered frequency signal;

a frequency divider in said feedback signal path that is configured to multiply a frequency of the filtered frequency signal by a preset ratio for generating a secondary output frequency signal; and a mixer in said direct signal path that is configured to mix the input frequency signal with the secondary output frequency signal to generate the output LO frequency signal.

2. A circuit of claim 1, wherein the switch circuit comprises a filter to generate the filtered frequency signal, the filter being one of a low pass filter, a high pass filter, a band pass filter or a notch filter.

3. A circuit of claim 1, further comprising:
a voltage controlled oscillator for generating the input frequency signal.

4. A circuit of claim 1, wherein the input frequency signal has a frequency substantially equal to 3.5 GHz.

5. A circuit of claim 1, wherein the divider comprises:
a secondary local oscillator (LO) circuit for generating the secondary output frequency signal from the filtered frequency signal, the secondary local oscillator circuit comprising:
  a secondary switch circuit comprising a secondary switch and a plurality of secondary filters, the secondary switch circuit being configured to filter the secondary output LO frequency signal through one of the secondary filters to produce a secondary filtered frequency signal;
  a secondary frequency divider that is configured to multiply a frequency of the secondary filtered frequency signal by a second preset ratio; and
  a secondary mixer that is configured to mix the filtered frequency signal with an output of the secondary frequency divider to generate the secondary output frequency signal.

6. A device comprising:
a local oscillator (LO) circuit for generating an output LO frequency signal from an input frequency signal, the circuit comprising:
  a direct signal path and a feedback signal path;
  a switch circuit in said feedback signal path comprising a switch and a plurality of filters, the switch circuit being configured to filter the output LO frequency signal through one of the filters to produce a filtered frequency signal;
  a frequency divider in said feedback signal path that is configured to multiply a frequency of the filtered frequency signal by a preset ratio for generating a secondary output frequency signal; and
  a mixer in said direct signal path that is configured to mix the input frequency signal with the secondary output frequency signal to generate the output LO frequency signal.

7. The device of claim 6, wherein the device comprises a transmitter operating based on one of the supplements of the IEEE802.11 standard.

8. The device of claim 6, wherein the device comprises a receiver operating based on one of the IEEE802.11a, IEEE802.11b or IEEE802.11g standards.

9. The device of claim 6, wherein the device further comprises:
an antenna for receiving a data signal over a wireless local area network; and,
a mixing arrangement for mixing the received data signal with the output LO frequency signal.

10. The device of claim 6, wherein the device further comprises:
an antenna for transmitting radio frequency data signal; and,
a mixing arrangement for mixing baseband data signal with the output LO frequency signal to generate the radio frequency data signal.

11. A communication system comprises an access point and at least one mobile station for communicating over a wireless medium, one of the access point or the mobile station comprising:
a local oscillator (LO) circuit for generating an output LO frequency signal from an input frequency signal, the circuit comprising:
  a direct signal path and a feedback signal path;
  a switch circuit in said feedback signal path comprising a switch and a plurality of filters, the switch circuit being configured to filter the output LO frequency signal through one of the filters to produce a filtered frequency signal;
  a frequency divider in said feedback signal path that is configured to multiply a frequency of the filtered frequency signal by a preset ratio for generating a secondary output frequency signal; and
  a mixer in said direct signal path that is configured to mix the input frequency signal with the secondary output frequency signal to generate the output LO frequency signal.

* * * * *